US006819003B2

(12) United States Patent
Farnworth (10) Patent No.: US 6,819,003 B2
(45) Date of Patent: Nov. 16, 2004

(54) RECESSED ENCAPSULATED MICROELECTRONIC DEVICES AND METHODS FOR FORMATION

(75) Inventor: Warren M. Farnworth, Nampa, ID (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 10/320,882

(22) Filed: Dec. 16, 2002

(65) Prior Publication Data

US 2003/0104653 A1 Jun. 5, 2003

Related U.S. Application Data

(62) Division of application No. 09/606,428, filed on Jun. 28, 2000, now Pat. No. 6,576,494.

(51) Int. Cl.⁷ .............................................. H01L 23/28
(52) U.S. Cl. ...................... 257/787; 257/778; 257/788; 257/792; 257/796
(58) Field of Search ................................ 257/778, 787, 257/796, 788, 792

(56) References Cited

U.S. PATENT DOCUMENTS

| 4,012,579 A | 3/1977 | Fox et al. |
| 4,862,245 A | 8/1989 | Pashby et al. |
| 5,107,328 A | 4/1992 | Kinsman |
| 5,128,831 A | 7/1992 | Fox, III et al. |
| 5,138,434 A | 8/1992 | Wood et al. |
| 5,140,404 A | 8/1992 | Fogal et al. |
| 5,252,853 A | 10/1993 | Michii |

(List continued on next page.)

OTHER PUBLICATIONS

Carson, John C., "Advances in Chip Level Packaging," Irvine Sensors Corporation, Costa Mesa, California, 36 pages, retrieved from the Internet on Sep. 22, 2003, <http://www.ece.jhu.edu/faculty/andreou/495/2002/LectureNotes/PackagingAdvancedpdf.pdf>.

(List continued on next page.)

Primary Examiner—Richard Elms
Assistant Examiner—Douglas Menz
(74) Attorney, Agent, or Firm—Perkins Coie LLP (57) ABSTRACT

A microelectronic device package and method for manufacture. In one embodiment, the device package can include a support member having a first surface, a second surface facing opposite the first surface and a cavity extending through the support member from the first surface to the second surface. A microelectronic device is disposed in the cavity and is supported in the cavity with a removable retention member. The microelectronic device is electrically coupled to the support member and is partially surrounded with an encapsulating material. The removable retention member is then removed to expose a surface of the microelectronic device. Accordingly, the package can have a low profile because the encapsulating material does not surround one of the microelectronic device surfaces. In one embodiment, a heat conductive material can be engaged with the exposed surface of the microelectronic device to increase the rate at which heat is transferred away from the microelectronic device.

22 Claims, 4 Drawing Sheets

U.S. PATENT DOCUMENTS

| | | |
|---|---|---|
| 5,252,857 A | 10/1993 | Kane et al. |
| 5,304,842 A | 4/1994 | Farnworth et al. |
| 5,471,369 A | 11/1995 | Honda et al. |
| 5,475,918 A | 12/1995 | Kubota et al. |
| 5,518,957 A | 5/1996 | Kim |
| 5,536,969 A | 7/1996 | Matsuoka |
| 5,583,371 A | 12/1996 | Hori |
| 5,593,927 A | 1/1997 | Farnworth et al. |
| 5,663,593 A | 9/1997 | Mostafazadeh et al. |
| 5,665,651 A | 9/1997 | Asada et al. |
| 5,677,566 A | 10/1997 | King et al. |
| 5,696,033 A | 12/1997 | Kinsman |
| 5,715,593 A | 2/1998 | Kimura |
| 5,729,049 A | 3/1998 | Corisis et al. |
| 5,739,585 A | 4/1998 | Akram et al. |
| 5,744,827 A | 4/1998 | Jeong et al. |
| D394,844 S | 6/1998 | Farnworth et al. |
| 5,815,000 A | 9/1998 | Farnworth et al. |
| D402,638 S | 12/1998 | Farnworth et al. |
| 5,847,455 A | 12/1998 | Manteghi |
| 5,851,845 A | 12/1998 | Wood et al. |
| 5,862,245 A | 1/1999 | Renouard et al. |
| 5,866,939 A | 2/1999 | Shin et al. |
| 5,866,953 A | 2/1999 | Akram et al. |
| 5,879,965 A | 3/1999 | Jiang et al. |
| 5,883,426 A | 3/1999 | Tokuno et al. |
| 5,891,753 A | 4/1999 | Akram |
| 5,891,797 A | 4/1999 | Farrar |
| 5,893,726 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,956,236 A | 9/1999 | Corisis et al. |
| 5,958,100 A | 9/1999 | Farnworth et al. |
| 5,973,393 A | 10/1999 | Chia et al. |
| 5,973,396 A | 10/1999 | Farnworth |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 6,008,070 A | 12/1999 | Farnworth |
| 6,020,624 A | 2/2000 | Wood et al. |
| 6,020,629 A | 2/2000 | Farnworth et al. |
| 6,025,728 A | 2/2000 | Hembree et al. |
| 6,028,356 A | 2/2000 | Kimura |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,051,878 A | 4/2000 | Akram et al. |
| 6,060,778 A | 5/2000 | Jeong et al. |
| 6,066,514 A | 5/2000 | King et al. |
| 6,072,233 A | 6/2000 | Corisis et al. |
| 6,072,236 A | 6/2000 | Akram et al. |
| 6,075,284 A | 6/2000 | Choi et al. |
| 6,075,288 A | 6/2000 | Akram |
| 6,089,920 A | 7/2000 | Farnworth et al. |
| 6,094,058 A | 7/2000 | Hembree et al. |
| 6,097,087 A | 8/2000 | Farnworth et al. |
| 6,103,547 A | 8/2000 | Corisis et al. |
| 6,107,122 A | 8/2000 | Wood et al. |
| 6,107,680 A | 8/2000 | Hodges |
| 6,117,382 A | 9/2000 | Thummel |
| 6,117,710 A | 9/2000 | Mostafazadeh et al. |
| 6,124,634 A | 9/2000 | Akram et al. |
| 6,133,068 A | 10/2000 | Kinsman |
| 6,137,162 A | 10/2000 | Park et al. |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,172,419 B1 | 1/2001 | Kinsman |
| 6,175,149 B1 | 1/2001 | Akram |
| 6,184,465 B1 | 2/2001 | Corisis |
| 6,198,172 B1 | 3/2001 | King et al. |
| 6,208,020 B1 | 3/2001 | Minamio et al. |
| 6,208,519 B1 | 3/2001 | Jiang et al. |
| 6,210,992 B1 | 4/2001 | Tandy et al. |
| 6,212,767 B1 | 4/2001 | Tandy |
| 6,215,175 B1 | 4/2001 | Kinsman |
| 6,215,177 B1 | 4/2001 | Corisis et al. |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,229 B1 | 5/2001 | Reinberg |
| 6,235,554 B1 | 5/2001 | Akram et al. |
| 6,246,108 B1 | 6/2001 | Corisis et al. |
| 6,246,110 B1 | 6/2001 | Kinsman et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,660 B1 | 7/2001 | Tandy |
| 6,277,671 B1 | 8/2001 | Tripard |
| 6,277,704 B1 | 8/2001 | Reinberg |
| 6,281,577 B1 | 8/2001 | Oppermann et al. |
| 6,284,571 B1 | 9/2001 | Corisis et al. |
| 6,291,894 B1 | 9/2001 | Farnworth et al. |
| 6,294,839 B1 | 9/2001 | Mess et al. |
| 6,297,543 B1 | 10/2001 | Hong et al. |
| 6,297,547 B1 | 10/2001 | Akram |
| 6,303,469 B1 | 10/2001 | Larson et al. |
| 6,303,981 B1 | 10/2001 | Moden |
| 6,303,985 B1 | 10/2001 | Larson et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,705 B1 | 12/2001 | Ahmad |
| 6,331,221 B1 | 12/2001 | Cobbley |
| 6,331,448 B1 | 12/2001 | Ahmad |
| 6,331,453 B1 | 12/2001 | Bolken et al. |
| 6,332,766 B1 | 12/2001 | Thummel |
| 6,337,510 B1 | 1/2002 | Chun-Jen et al. |
| 6,339,254 B1 * | 1/2002 | Venkateshwaran et al. . 257/686 |
| 6,344,976 B1 | 2/2002 | Schoenfeld et al. |
| 6,403,398 B2 | 6/2002 | Ohuchi et al. |
| 6,429,528 B1 | 8/2002 | King et al. |
| 6,498,393 B2 | 12/2002 | Fujimoto et al. |
| 6,501,184 B1 * | 12/2002 | Shin et al. .................. 257/778 |
| 6,516,516 B1 | 2/2003 | Lee |
| 6,518,659 B1 | 2/2003 | Glenn |
| 6,576,494 B1 | 6/2003 | Farnworth |
| 6,630,729 B2 | 10/2003 | Huang |
| 2002/0027273 A1 | 3/2002 | Huang |
| 2003/0001285 A1 | 1/2003 | Shin et al. |
| 2003/0042581 A1 | 3/2003 | Fee et al. |
| 2003/0104654 A1 | 6/2003 | Farnworth |
| 2003/0164554 A1 | 9/2003 | Fee et al. |
| 2004/0026773 A1 | 2/2004 | Koon et al. |

OTHER PUBLICATIONS

U.S. patent application Ser. No. 10/323,150, Chye et al., filed Dec. 18, 2002.

Ishino, Toshiaki, Silicone Adhesive Tape, Nitto Technical Report, vol. 38, No. 2, pp. 49–50, Dec. 2000, <http://www.nitto.com/rd/2000_2/15ishinoe.qxp.pdf>.

Kuhnlein, Gerd, "A design and manufacturing solution for high reliable non–leaded CSP's like QFN," 2000 Electronics Packaging Technology Conference, pp. 169–175.

Tech Connect, QFN Leadframes, ASM Pacific Technology Ltd., pp. 10–14.

Siliconware Precision Industries Ltd., TSOP 1 (Thin Small Outline Package type 1), 2 pages, 2000–2002, <http://www.spil.com/tw/tsopi.html>.

Intersil, L56.8X8 56 Lead Quad Flat No–Lead Plastic Package, 1 page; Dec. 2002, <http://www.intersil.com/data/pk/L56.8x8.pdf>.

Amkor Technology, "Products: Leadframe: MicroLeadFrame (MLF)." <http://www.amkor.com/Products/all_products/MLF.cfm (Aug. 1, 2001), 5 pages.

Amkor Technology, "Application Notes for Surface Mount Assembly of Amkor's Micro LeadFrame (MLF) Packages," Mar. 2001/Rev. B, 14 pages.

Amkor Technology, "Automotive/Thermal Enhanced Power Products." (Aug. 2000), 16 pages.

Amkor Technology, "RF Wireless Fact Sheet," Feb. 2000, 1 page.

* cited by examiner

RECESSED ENCAPSULATED MICROELECTRONIC DEVICES AND METHODS FOR FORMATION

CROSS REFERENCE TO RELATED APPLICATION

This application is a divisional of U.S. patent application Ser. No. 09/606,428, filed on Jun. 28, 2000 now U.S. Pat. No. 6,576,494.

TECHNICAL FIELD

This invention relates to recessed encapsulated microelectronic devices, and methods for forming such encapsulated devices.

BACKGROUND OF THE INVENTION

Packaged microelectronic assemblies, such as memory chips and microprocessor chips, typically include a microelectronic device mounted to a substrate and encased in a plastic protective covering. The device includes functional features, such as memory cells, processor circuits and interconnecting circuitry. The device also typically includes bond pads electrically coupled to the functional features. The bond pads are coupled to pins or other types of terminals that extend outside the protective covering for connecting the microelectronic device to buses, circuits and/or other microelectronic assemblies.

Figure 1:
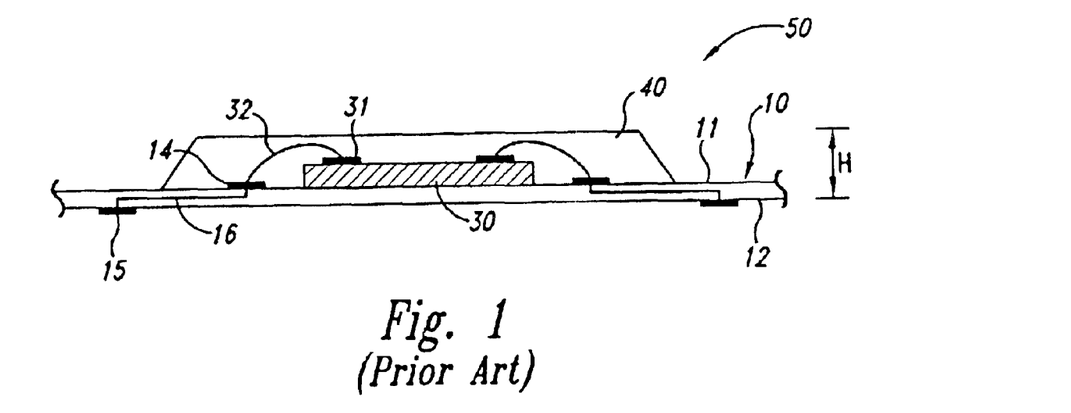
FIG. 1 is a partially schematic, cross-sectional side elevational view of a microelectronic die package in accordance with the prior art.

In one conventional arrangement, shown in FIG. 1, a packaged device 50 includes a substrate 10 (such as a printed circuit board or "PCB") having an upper surface 11 and a lower surface 12. The substrate 10 includes conductive substrate pads 14 on the upper surface 11 connected to ball pads 15 on the lower surface 12 by a plurality of vias 16. A microelectronic die 30 having die bond pads 31 is positioned on the upper surface 11, and the die bond pads 31 are connected with to the substrate pads 14 by wire bonds 32. The microelectronic die 30 is then encapsulated with an encapsulating material 40 to protect the die 30 and the wire bonds 32. Solder balls can then be connected to the ball pads 15 for linking the die 30 to a circuit or another device.

Figure 2:
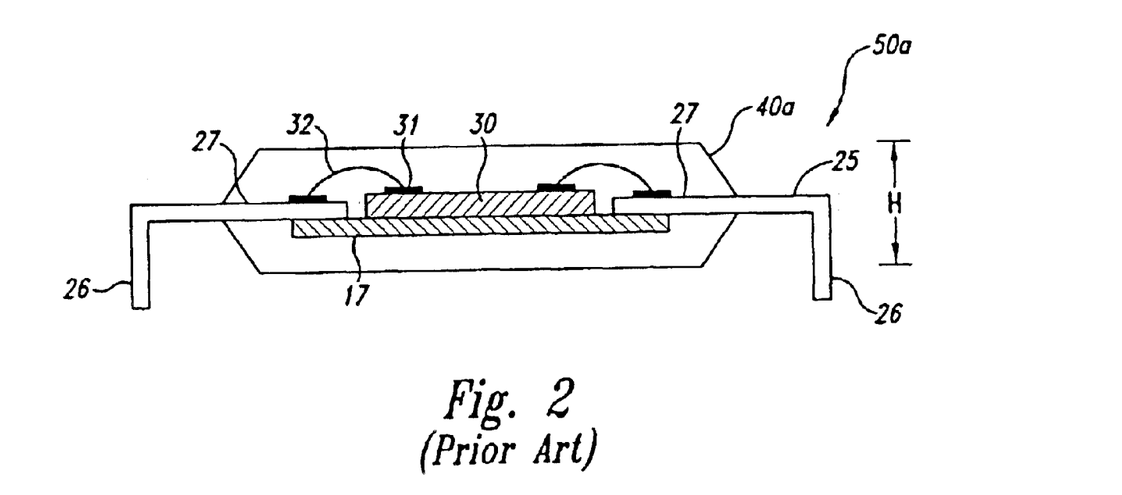
FIG. 2 is a partially schematic, cross-sectional side elevational view of a another microelectronic die package in accordance with the prior art.

In another conventional arrangement, shown in FIG. 2, a package 50a can include a lead frame 25 having lead fingers 27 positioned adjacent to the die 30. In one aspect of this arrangement, the lead frame 25 can include a paddle (not shown) that extends between the lead fingers 27 to support the die 30. Alternatively, the paddle can be replaced with a layer of thermoset adhesive material 17 that extends between the lead fingers 27 and supports the die 30. The thermoset material 17 is then heated to bond the material to the die 30, and the bond pads 31 on the die 30 are wire bonded to the lead fingers 27. An encapsulating material 40a is disposed over both the die 30 and the thermoset material 17 to form the package 50a, and the ends of the lead fingers 27 are bent to form pins 26 for connecting the die 30 to other devices or circuits.

The packages 50 and 50a described above with reference to FIGS. 1 and 2 can suffer from several drawbacks. For example, the overall height H of the packages 50 and 50a may be so large that it is difficult to integrate the packages with low-profile electronic products, such as mobile telephones and hand-held or laptop computers. Furthermore, it may be difficult to transfer heat from the dies 30 because the dies 30 are surrounded on all sides by materials having low thermal conductivities. For example, the die 30 shown in FIG. 1 is surrounded by the encapsulating material 40 and the substrate 10, and the die 30 shown in FIG. 2 is surrounded by the encapsulating material 40a and the thermoset material 17. It is particularly important to dissipate heat in high-speed microprocessors and memory devices to maintain the performance levels of these devices. Thus, the package 50 and 50a may not be adequate for use in many types of products.

SUMMARY

The present invention is directed toward microelectronic device packages and methods for forming such packages. A method in accordance with one aspect of the invention includes positioning a microelectronic device at least partially within a cavity of a support member having a first surface and a second surface facing opposite the first surface, with the cavity extending through the support member from the first surface to the second surface. The method can further include supporting the microelectronic device relative to the cavity with a removable retention member. The microelectronic device is electrically coupled to the support member and a portion of the microelectronic device is encased with an encapsulating material. The removable retention member is then removed from the support member.

In a further aspect of the invention, the microelectronic device has a first face and a second face facing opposite the first face. The second face of the microelectronic device is initially engaged with the removable retention member and is exposed when the removable retention member is removed. In still a further aspect of the invention, a heat transfer material can be applied to the second face of the microelectronic device to conduct heat away from the microelectronic device.

The invention is also directed toward a microelectronic device package. In one aspect of the invention, the package can include a support member having a first surface, a second surface facing opposite the first surface, and a cavity extending through the support member from the first surface to the second surface. The support member defines a first region extending outwardly from the first surface and a second region extending outwardly from the second surface. A microelectronic device having a first face and a second face facing opposite the first face is disposed in the cavity. The package further includes an encapsulating material positioned in the first region defined by the support member, but not in the second region, such that the encapsulating material at least partially surrounds the microelectronic device adjacent to the first face of the microelectronic device.

DETAILED DESCRIPTION

The present disclosure describes packaged microelectronic devices and methods for packaging such devices. Many specific details of certain embodiments of the invention are set forth in the following description and in FIGS. 3A–5D to provide a thorough understanding of these embodiments. One skilled in the art, however, will understand that the present invention may have additional embodiments, or that the invention may be practiced without several of the details described below.

Figure 3A:
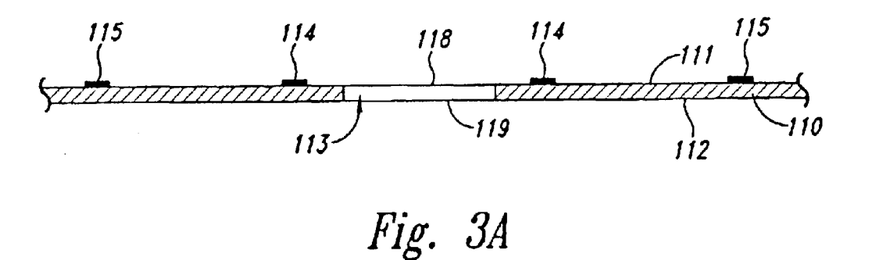
FIGS. 3A–3F are partially schematic, cross-sectional side elevational views depicting a process for forming a packaged microelectronic device in accordance with an embodiment of the invention.

FIGS. 3A–3E illustrate a method for forming a microelectronic device package in accordance with an embodiment of the invention. Referring first to FIG. 3A, the package can include a support member 110, such as a PCB, having an upwardly facing upper surface 111 and a downwardly facing lower surface 112. In one aspect of this embodiment, the support member 110 can have a thickness of from about 100 microns to about 3,175 microns. The support member 110 can have other suitable thicknesses in other embodiments. In another aspect of this embodiment, the support member 110 can be formed from a polyimide, BCB, FR4, bismalimide triazine, or another suitable material.

The support member 110 can have support member pads 114 positioned on the upper surface 111 and connected with vias (not shown) to ball pads 115 that are also positioned on the upper surface 111. In another embodiment, the support member 110 can have other bond pads or terminals for coupling to a microelectronic device. In either embodiment, the support member 110 further includes a cavity 113 that extends through the entire support member 110 from the upper surface 111 to the lower surface 112. Accordingly, the cavity 113 includes an upper opening 118 at the upper surface 111 and a lower opening 119 at the lower surface 112.

Figure 3B:
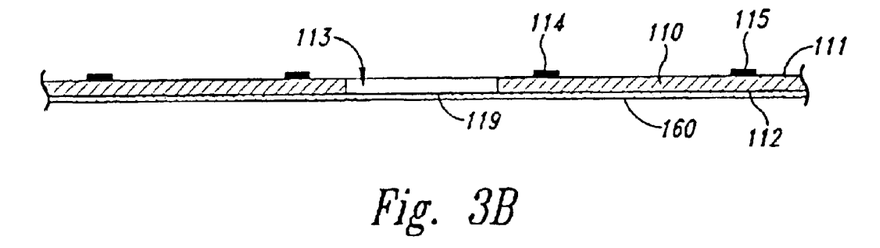

Referring now to FIG. 3B, a releasable retention member or cover 160 is releasably attached to the lower surface 112 of the support member 110. In one aspect of this embodiment, the retention member 160 includes an adhesive layer that is releasably adhered to the lower surface 112 of the support member 110. For example, the retention member 160 can include a pressure-sensitive adhesive that attaches the retention member 160 to the support member 110. In a further aspect of this embodiment, the adhesive can be a high-temperature adhesive for use in subsequent processing steps (such as high temperature wire bonding) that subject the adhesive to elevated temperatures. Alternatively, the adhesive can be a room-temperature adhesive for use in subsequent processing steps that do not subject the adhesive to significantly elevated temperatures. Suitable adhesives for both embodiments are available from 3M of St. Paul, Minn.

Alternatively, the retention member 160 can include an adhesive that is activated and/or released by methods other than applying pressure. For example, the adhesive can be a radiation-sensitive adhesive that bonds to the lower surface 112 and/or detaches from the lower surface 112 upon exposure to radiation at a selected wavelength. In another embodiment, the adhesive can be temperature sensitive (e.g., a thermoplastic) adhesive. Accordingly, the adhesive can be heated and cooled to initially adhere the retention member 160 to the microelectronic device, and then heated again to remove the retention member 160, as described below with reference to FIG. 3E. In still another embodiment, the retention member 160 can be attached to the lower surface 112 by other forces, such as electrostatic forces. In any of these embodiments, the retention member 160 extends over all or a portion of the lower opening 119 of the cavity 113 in the support member 110. For example, the retention member 160 can include a solid film or, alternatively, the retention member 160 can be perforated, so long as at least a portion of the retention member 160 extends over at least a portion of the lower opening 119.

Figure 3C:
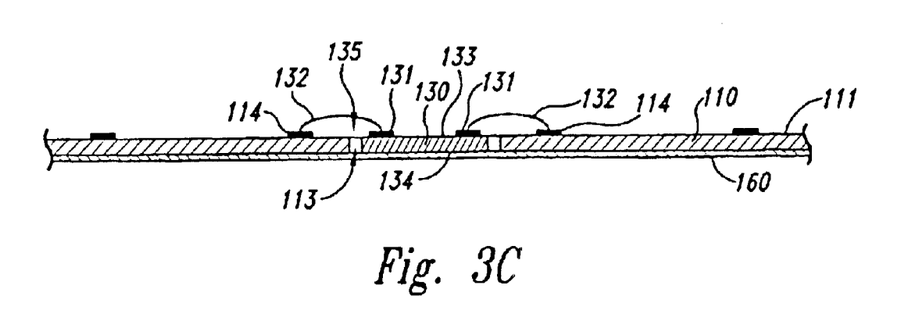

Referring now to FIG. 3C, a microelectronic device 130, such as a DRAM chip or microprocessor chip, is positioned in the cavity 113. The microelectronic device 130 has an upper face 133 with device bond pads 131, and a lower face 134 opposite the upper face 133. The microelectronic device 130 is supported relative to the cavity 113 by the retention member 160. For example, when the retention member 160 includes an adhesive, the adhesive engages the lower face 134 of the microelectronic device 130 and at least restricts movement of the microelectronic device 130 relative to the support member 110. The microelectronic device 130 is then electrically coupled to the support member 110 by attaching wire bonds 132 between the device bond pads 131 on microelectronic device 130 and the support member pads 114 on the support member 110.

In one aspect of this embodiment, the microelectronic device 130 is slightly smaller than the cavity 113, such that the perimeter of microelectronic device 130 is spaced apart from the walls of the cavity 113 by a gap 135. In another aspect of this embodiment, the microelectronic device 130 has a thickness between the upper face 133 and the lower face 134 of about 500 microns, and in other embodiments, this thickness can be greater or less than 500 microns. Accordingly, the upper face 133 can be flush with the upper surface 111 of the support member 110, or the upper face can project above or below the upper surface 111. The position of the upper face 133 relative to the upper surface 111 depends on the thickness of the microelectronic device 130 and the thickness of support member 110. However, in any of these embodiments, the lower face 134 is generally flush with the lower surface 112 of the support member 110.

Figure 3D:
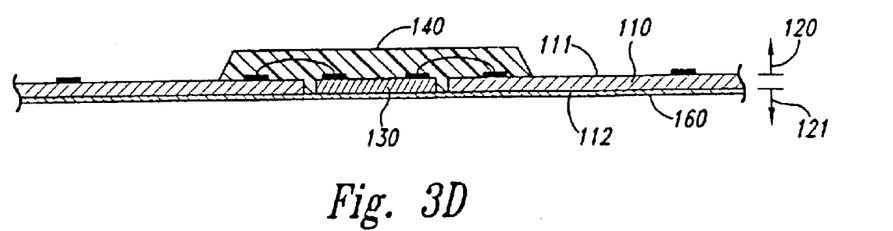

Referring now to FIG. 3D, the microelectronic device 130 is encapsulated by disposing an encapsulating material 140 over the microelectronic device 130 and a portion of the upper surface 111 of the support member 110. The encapsulating material 140 can fill in the gap 135 (FIG. 3C) between the microelectronic device 130 and the walls of the cavity 113. The encapsulating material 140 can be an epoxy or other generally non-conductive, conformal material.

In one aspect of an embodiment shown in FIG. 3D, the support member 110 defines an upper region 120 extending outwardly away from the upper surface 111 and a lower region 121 extending outwardly away from the lower surface 112. Because the retention member 160 is positioned tightly against the lower surface 112, the encapsulating material 140 extends only into the upper region 120 and into the gap 135, but the encapsulating material 140 does not extend into the lower region 121. As a result, the lower face 134 of the microelectronic device 130 remains free of the encapsulating material 140.

Figure 3E:
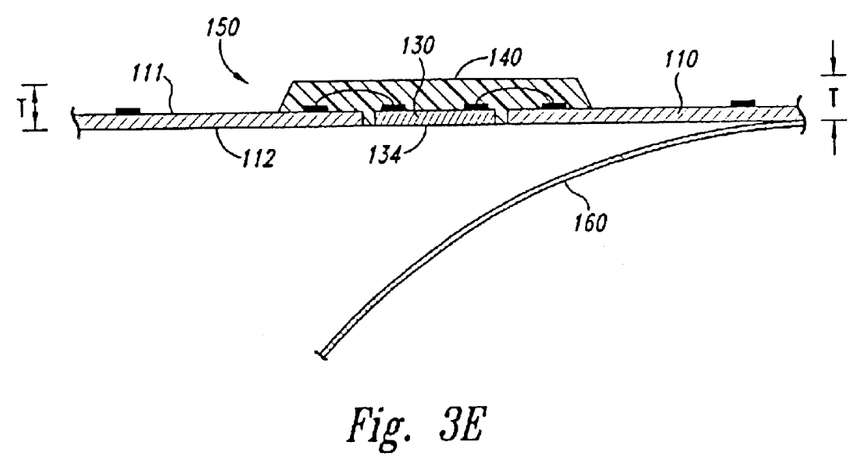
Figure 3F:
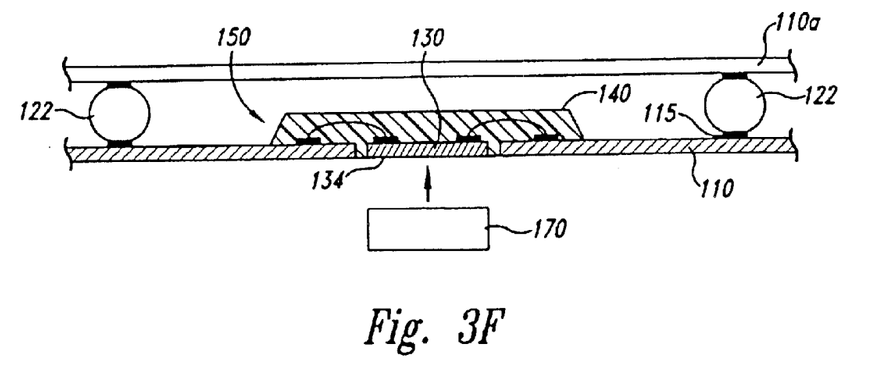

Referring now to FIG. 3E, the removable retention member 160 is released or removed from the lower surface 112 of the support member 110 to expose the lower surface 112 of the support member 110 and the lower face 134 of the microelectronic device 130. The resulting microelectronic device package 150 can then be singulated from other packages (not shown) on the same support member 110 and then coupled to another device. For example, in one embodiment shown in FIG. 3F, the package 150 can be coupled with solder balls 122 to another support member 110a in a board-over-chip ("BOC") configuration. In a further aspect of this embodiment, a heatsink 170 can be coupled to the exposed lower face 134 of the microelectronic device 130 to increase the rate at which heat is dissipated from the microelectronic device 130. For example, the heat sink 170 can include silicon nitride or another material having a greater thermal conductivity than the encapsulating material 140. Alternatively, the lower face 134 can remain exposed to increase the rate at which heat is transferred by convection away from the device 130. In either embodiment, the rate at which heat is transferred away from the microelectronic device 130 can be greater than the conventional arrangement in which the lower face 134 of the microelectronic device 130 is covered with an encapsulating material.

One feature of an embodiment of the method and package 150 described above with reference to FIGS. 3A–3F is that on overall thickness T (FIG. 3E) of the package 150 is less than the thickness of a corresponding conventional package. The thickness is reduced because the microelectronic device 130 is recessed in the support member 110 and because there is no encapsulating material 140 on the underside of the package 150. For example, thickness T can be 1400 microns or less in one embodiment, with the microelectronic device 130 projecting 150–250 microns or less above the upper surface 111 of the support member 110. An advantage of this feature is that the package 150 has a low profile and can more easily be used in compact devices, such a mobile telephones and hand-held computing devices.

Another feature of an embodiment of the method and package 150 described above with reference to FIGS. 3A–3F is that the lower face 134 of the microelectronic device 130 can remain exposed after the microelectronic device 130 is encapsulated. An advantage of this feature is that the heat transfer rate from the microelectronic device 130 can be increased relative a microelectronic device that is fully encapsulated. Accordingly, the microelectronic device 130 can operate at a lower temperature to increase the lifespan and/or the reliability of the microelectronic device 130.

Figure 4:
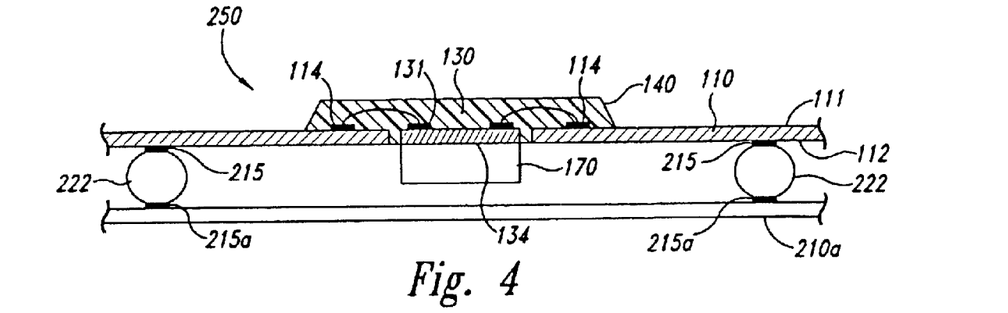
FIG. 4 is a partially schematic, cross-sectional side elevational view of a packaged microelectronic device in accordance with another embodiment of the invention.

FIG. 4 is a partially schematic, cross-sectional side elevational view of a microelectronic device package 250 having a first support member 110 coupled to a second support member 210a in a ball grid array ("BGA") arrangement in accordance with another embodiment of the invention. In one aspect of this embodiment, the support members pads 114 on the upper surface 111 of the first support member 110 are connected with vias (not shown) to first ball pads 215 on the lower surface 112 of the first support member 110. The second support member 210a has second ball pads 215a aligned with the first ball pads 215. A solder ball 222 extends between selected first ball pads 215 and corresponding second ball pads 215a to electrically couple the microelectronic device 130 to the second support member 215a. As described above with reference to FIG. 3F, the package 250 can include a heatsink 170 coupled to the lower face 134 of the microelectronic device 130. The heatsink 170 can extend part-way to the second support member 210a, or can contact the second support member 210a. Alternatively, the heatsink 170 can be eliminated to allow for convective heat transfer directly from the lower face 134 of the microelectronic device 130.

Figure 5A:
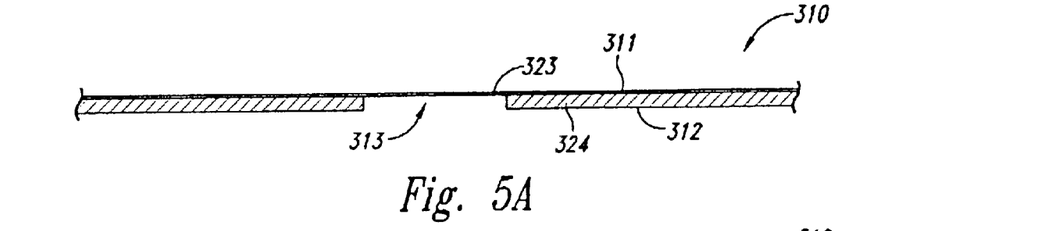
FIGS. 5A–5D are partially schematic, cross-sectional side elevational views depicting a process for forming a packaged microelectronic device in accordance with still another embodiment of the invention.
Figure 5B:
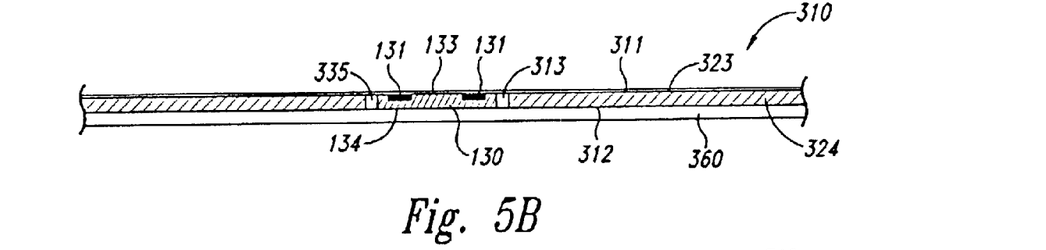

FIGS. 5A–5B are partially schematic, cross-sectional side elevational views depicting a process for forming a packaged microelectronic device in accordance with still another embodiment of the invention. Referring first to FIG. 5A, the package can include a support member 310 having a film layer 324 with an upwardly facing upper surface 311 and a downwardly facing lower surface 312. A cavity 313 extends through the film layer 324 from the upper surface 311 to the lower surface 312. A trace layer 323 having conductive traces extends over the cavity 313 and adjacent to the upper surface 311 of the film layer 324.

Referring now to FIG. 5B, the microelectronic device 130 is disposed in the cavity 313 with the upper face 133 of the microelectronic device contacting the trace layer 323 and each device bond pad 131 contacting an individual trace of the trace layer 323. A retention member 360 is attached to the lower surface 312 of the film layer 324 to extend over part or all of the cavity 313. The retention member 360 can attach to the lower surface 312 by adhesive forces, electrostatic forces, or other forces as described above with reference to FIG. 3B. The retention member 360 also attaches to the lower face 134 of the microelectronic device 130. Accordingly, the retention member 360 can hold the microelectronic device 130 in place in the cavity 313 while a tab bonder tool (not shown) connects the traces of the trace layer 323 to the device bond pads 131.

Figure 5C:
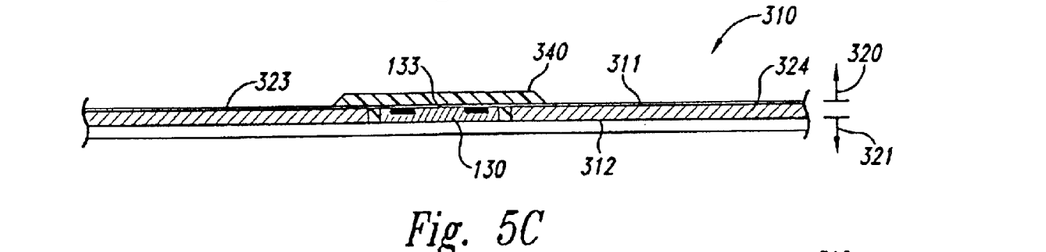
Figure 5D:
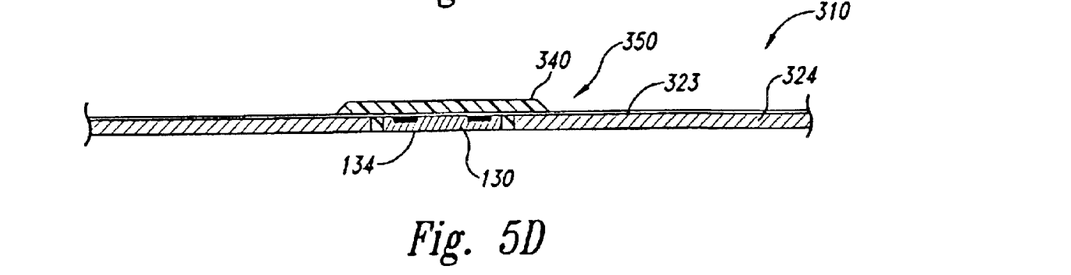

Referring now to FIG. 5C, an encapsulating material 340 is disposed on the trace layer 323, the upper face 133 of the microelectronic device 130, and the upper surface 311 of the film layer 324 to encapsulate the microelectronic device 130. The support member 310 defines an upper region 320 extending outwardly away from the trace layer 323, and a lower region 321 extending outwardly away from the lower surface 312 of the film layer 324 in a manner generally similar to that described above with reference to FIG. 3D. Accordingly, the encapsulating material 340 extends into the upper region 120 and into a gap 335 (FIG. 3B) between the microelectronic device 130 and the walls of the cavity 313, but it does not extend into the lower region 121. When the retention member 360 is removed (FIG. 5D), the resulting device package 350 protects and supports the microelectronic device 130 while leaving the lower face 134 of the microelectronic device 130 free of the encapsulating material 340. Accordingly, the overall thickness of the package 350 can be less than that of corresponding conventional packages, and the rate at which heat is transferred away from the microelectronic device 130 can be increased relative to that of conventional packages.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A microelectronic device package, comprising:
   a support member having a first surface, a second surface facing opposite the first surface, and a cavity extending through the support member from the first surface to the second surface, the support member defining a first region extending outwardly from the first surface of the support member and a second region extending outwardly from the second surface of the support member;
   a microelectronic device having a first face and a second face facing opposite the first face, the microelectronic device being disposed in the cavity; and
   an encapsulating material positioned in the first region defined by the support member but not in the second region, the encapsulating material at least partially surrounding the microelectronic device adjacent to the first face of the microelectronic device.

2. The package of claim 1, further comprising an adhesive layer adjacent to the second surface of the support member with an adhesive portion of the adhesive layer extending over at least a portion of the cavity adjacent to the second surface of the support member, the adhesive portion being removably engaged with the microelectronic device.

3. The package of claim 1 wherein the microelectronic device includes a DRAM chip.

4. The package of claim 1, wherein the support member is a first support member, further comprising a second support member electrically coupled to the first support member with solder balls extending between the first surface of the first support member and solder ball pads of the second support member, the second support member facing toward the encapsulating material.

5. The package of claim 1, wherein the support member is a first support member, further comprising a second support member electrically coupled to the first support member with solder balls extending from the second surface of the first support member to solder ball pads on the second support member, the second support member facing the second surface of the first support member.

6. The package of claim 1 wherein the microelectronic device has first wire bond pads and the support member has second wire bond pads, further comprising electrically conductive wire bonds connected between the first and second bond pads.

7. The package of claim 1 wherein the encapsulating material has a first heat transfer coefficient, further comprising a heat conductive material in direct contact with the second face of the microelectronic device, the heat conductive material having a second heat transfer coefficient higher than the first heat transfer coefficient.

8. The package of claim 7 wherein the heat conductive material includes silicon nitride.

9. The package of claim 1 wherein, further wherein the second face of the microelectronic device at least approximately flush with the second surface of the support member and the first face of the microelectronic device is approximately flush with or recessed from the first surface of the support member.

10. The package of claim 1, further wherein the second face of the microelectronic device is at least approximately flush with the second surface of the support member and the first face of the microelectronic projects outwardly from the first surface of the support member.

11. The package of claim 1 wherein a distance from the second surface of the support member to an external surface of the encapsulating material is about 1400 microns of less support member has a thickness between the first and second surfaces of at least 100 microns.

12. The package of claim 1 wherein a thickness of the microelectronic device between the first and second faces is about 500 microns.

13. A microelectronic device package, comprising:
a support member having a first surface facing a first direction, a second surface facing a second direction opposite the first direction and a cavity extending through the support member from the first surface to the second surface;
a microelectronic device disposed in the cavity, the microelectronic device having a first face facing the first direction and a second face facing the second direction;
an encapsulating material having a first heat transfer coeffecient, the encapsulating material at least partially covering the first face of the microelectronic device; and a heat transfer medium disposed adjacent to the second face of the microelectronic device, the heat transfer medium having a second heat transfer coefficient higher than the first heat transfer coefficient.

14. The package of claim 13 wherein the support member defines a first region extending outwardly from the first surface of the support member and a second region extending outwardly from the second surface of the support member, further wherein the encapsulating material is positioned in the first region and not in the second region.

15. The package of claim 13 wherein the support member is a first support member, further comprising a second support member electrically coupled to the first support member with solder balls extending between the first surface of the first support member and solder ball pads of the second support member, the second support member facing toward the encapsulating material.

16. The package of claim 13 wherein the support member is a first support member, further comprising a second support member electrically coupled to the first support member with solder balls extending from the second surface of the first support member to solder ball pads on the second support member, the second support member facing the second surface of the first support member.

17. The package of claim 13 wherein the heat conductive material includes silicon nitride.

18. The package of claim 13 wherein, further wherein the second face of the microelectronic device at least approximately flush with the second surface of the support member and the first face of the microelectronic device is approximately flush with or recessed from the first surface of the support member.

19. The package of claim 13 wherein, further wherein the second face of the microelectronic device at least approximately flush with the second surface of the support member and the first face of the microelectronic projects outwardly from the first surface of the support member.

20. A microelectronic device package, comprising:
a support member having a first surface, a second surface facing opposite the first surface, and a cavity extending through the support member from the first surface to the second surface, the support member defining a first region extending outwardly from the first surface of the support member and a second region extending outwardly from the second surface of the support member;
a microelectronic device disposed in the cavity, the microelectronic device having a first face and a second face facing opposite the first face;
an encapsulating material positioned in the first region defined by the support member but not the second region, the encapsulating material covering at least a portion of the microelectronic device adjacent to the first face of the microelectronic device; and
a removable retention member adjacent to the second surface of the support member with a portion of the retention member extending over at least a portion of the cavity adjacent to the second surface of the support member and engaged with the second face of the microelectronic device.

21. The device package of claim 20 wherein the retention member includes an adhesive layer.

22. The device package of claim 20 wherein the retention member has an electrostatic charge.

* * * * *